(12) United States Patent
Miitsu et al.

(10) Patent No.: US 6,435,401 B1
(45) Date of Patent: Aug. 20, 2002

(54) APPARATUS AND A METHOD FOR REMOVING SOLDER FROM AN OBJECT

(75) Inventors: Takeshi Miitsu; Kaoru Katayama; Yasuhiro Yamamoto, all of Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/618,456

(22) Filed: Jul. 18, 2000

(30) Foreign Application Priority Data

Jul. 23, 1999 (JP) .......................................... 11-208793

(51) Int. Cl.[7] .............................................. B23K 1/018
(52) U.S. Cl. ...................................... 228/264; 228/20.1
(58) Field of Search ........................ 228/19, 20.1, 20.5, 228/264, 119, 102, 103

(56) References Cited

U.S. PATENT DOCUMENTS

| | | | | |
|---|---|---|---|---|
| 3,731,866 A | * | 5/1973 | Mason et al. ................... 228/6 |
| 4,070,856 A | * | 1/1978 | Litt .............................. 60/407 |
| 4,561,586 A | * | 12/1985 | Abel et al. .................. 228/264 |
| 4,813,589 A | * | 3/1989 | Palmer et al. ............. 228/119 |
| 4,942,997 A | * | 7/1990 | Sinkunas et al. ........... 228/56.1 |
| 4,972,990 A | * | 11/1990 | Abbagnaro et al. ........... 228/20 |
| 5,380,982 A | * | 1/1995 | Fortune ...................... 219/230 |
| 5,431,324 A | * | 7/1995 | Kajiwara et al. ........... 228/102 |
| 5,542,601 A | * | 8/1996 | Fallon et al. ................ 228/119 |
| 5,553,768 A | * | 9/1996 | Lasto et al. ................. 228/102 |
| 5,605,277 A | * | 2/1997 | Jackson et al. ............. 228/264 |
| 5,715,592 A | * | 2/1998 | Mori et al. ..................... 29/762 |
| 5,785,237 A | * | 7/1998 | Lasto et al. ............ 228/180.22 |
| 5,804,795 A | * | 9/1998 | Fortune ...................... 219/229 |
| 6,043,458 A | * | 3/2000 | Fortune ...................... 219/230 |
| 6,201,930 B1 | * | 3/2001 | Close et al. ................ 392/379 |

* cited by examiner

Primary Examiner—Tom Dunn
Assistant Examiner—Zidia Pittman
(74) Attorney, Agent, or Firm—Mattingly, Stanger & Malur, P.C.

(57) ABSTRACT

A solder-removing apparatus includes a heating portion for heating the object having the solder adhered thereto, a measuring portion for measuring the distance from the measuring portion to the object, a solder-drawing portion for drawing the molten solder on the object by suction, an X-Y moving portion for moving the object in an X-direction or a Y-direction, a Z moving portion for moving the object relative to the solder-drawing portion in a Z-direction, and a control portion for controlling the X-Y moving portion and the Z moving portion. During the time when the molten solder on the object is drawn by the solder-drawing portion, the control portion causes the X-Y moving portion to move the object, and also causes the Z moving portion to move the object relative to the solder-drawing portion in accordance with the distance, measured by the measuring portion, so that the distance between the solder-drawing portion and the object can be kept constant.

14 Claims, 6 Drawing Sheets

APPARATUS AND A METHOD FOR REMOVING SOLDER FROM AN OBJECT

BACKGROUND OF THE INVENTION

This invention relates to a solder-removing apparatus, and more particularly to a solder-removing apparatus suitably used in a repairing operation.

Recently, the added value of electronic parts has increased. When an electronic part has been found defective, it is important not to discard the whole of this electronic part but to use a repair technique in which a defective factor is removed, or only a defective component is exchanged with a new one. In a repairing operation for an electronic part, a soldered part is often removed. In such a case, solder remains on the part, and therefore there is required a technique of leveling the unnecessary solder.

For example, in the case of removing a BGA-type LSI, solder, adhered to the LSI, is heated to be melted, and then a Cu plate is pressed against the LSI. As a result, the solder is transferred to the Cu plate, thus completing the leveling operation. Thereafter, fresh solder balls are supplied to an LSI.

With respect to a high-density module, the whole of the module is formed into a box-shape, and the interior of this module is sealed air-tight so as to prevent moisture and foreign matters from intruding into the module. Solder is used at a sealing portion of the module. In a repairing operation, the sealing portion of the module must be heated to be melted so as to open the module. After the repairing operation is completed, the module is again sealed. At this time, fresh solder is supplied to the sealing portion of the module so that the sealing quality will not be deteriorated. At this time, the residual solder, remaining at the sealing portion, need to be beforehand leveled so that an appropriate amount of solder can be supplied to the sealing portion. In the ordinary leveling technique, however, the leveling is effected in the atmosphere, using a solder wick, a soldering iron and a flux.

SUMMARY OF THE INVENTION

However, in the method of leveling the solder by pressing the Cu plate against the solder, there is a possibility that a part (e.g. a bare chip), having an electronic circuit or a protective film formed on a surface of a substrate, is damaged. And besides, in the case where the LSI is large in size, warp of the LSI due to heating increases, so that the Cu plate can not be pressed against the LSI uniformly over an entire area thereof.

Furthermore, in the method of leveling the solder at the sealing portion of the module, using the solder wick and the soldering iron, the efficiency of the operation was low, and besides the leveling quality varied from operator to operator. In addition, since the flux was used, a step of washing the residual flux out was needed.

Namely, with the above methods, the solder could not be properly removed from some members or portions, from which the solder is to be removed, thus inviting a problem that the general-purpose ability was low.

It is therefore an object of this invention to provide a solder-removing apparatus of a high general-purpose ability capable of removing solder regardless of the type of member or portion from which the solder is to be removed.

A solder-removing apparatus of the present invention includes a heating portion for heating the object having the solder adhered thereto, a measuring portion for measuring the distance from the measuring portion to the object, a solder-drawing portion for drawing the molten solder on the object by suction, an X-Y moving portion for moving the object in an X-direction and a Y-direction, a Z moving portion for moving the object relative to the solder-drawing portion in a Z-direction, and a control portion for controlling the X-Y moving portion and the Z moving portion. During the time when the molten solder on the object is drawn by the solder-drawing portion, the control portion causes the X-Y moving portion to move the object, and also causes the Z moving portion to move the object relative to the solder-drawing portion in accordance with the distance, measured by the measuring portion, so that the distance between the solder-drawing portion and the object can be kept constant.

In the solder-removing apparatus, the solder is drawn by the solder-drawing portion while keeping the distance between the solder-drawing portion and the object constant. Therefore, a force is not applied to the object itself. And besides, even when the object has concave and convex portions or the like, the solder can be effectively removed.

DESCRIPTION OF THE PREFERRED EMBODIMENTS

The construction and operation of one preferred embodiment of a solder-removing apparatus of the invention will now be described with reference to the drawings.

First, the overall construction of the solder-removing apparatus of this embodiment will be described in FIG. 1.

A stage 20 is provided within a chamber 10. The stage 20 includes an X-stage 22 movable in an X-direction, a Y-stage 24 movable in a Y-stage, and a Z-stage 26 movable in a Z-direction. The movement of the stage 20 in the X-, Y- and Z-directions is controlled by a stage control portion 100.

A heater 30 is mounted on the stage 20. A first uniformly-heating jig 32 is mounted on an upper surface of the heater 30. A second uniformly-heating jig 34 is received in a recess formed in an upper surface of the first uniformly-heating jig 32. Pockets are formed in an upper surface of the second uniformly-heating jig 34, and members 40, each having solder adhered thereto, are received in these pockets, respectively.

The solder-adhered member 40 is, for example, an LSI of the bare chip-type. For example, the solder-adhered member 40 comprises a substrate 42 such as a semiconductor substrate, and residual solder 44, generally in the form of bumps, adhered to the substrate 42. Each of the solder-adhered members 40 is received in the pocket in the uniformly-heating jig 34, with the solder-adhered surface thereof directed upwardly. The pocket is slightly larger in size than the solder-adhered member 40. Suction holes (not shown) are formed in the surface of the pocket. The solder-adhered member 40, received in the pocket in the uniformly-heating jig 34, is held or fixed in this pocket by suction. The depth of the pocket in the uniformly-heating jig 34 is generally equal to the height of the lowest portion of the solder-adhered surface of the substrate 42 of the solder-adhered member 40. When the solder-adhered member 40 is held in the pocket in the uniformly-heating jig 34, the solder portion 44 projects upwardly from this pocket.

In the illustrated embodiment, the uniformly-heating jig 34 can hold, for example, sixteen (16) solder-adhered members 40 at the same time. For example, the uniformly-heating jig 34 can have a square pocket one side of which is 150 mm, in which case a square cooling jacket, one side of which is 150 mm, can be received and held in this pocket. Namely, by exchanging the uniformly-heating jig 34, the solder-removing apparatus can be used for removing solder from the LSIs of the bare chip-type and also for removing solder from the cooling jacket.

Heat from the heater 30 is rendered into a uniform temperature distribution by the uniformly-heating jigs 32 and 34, and is transmitted to the solder-adhered members 40. The uniformly-heating jigs 32 and 34 are made, for example, of Cu. The temperature of the heater 30 is measured by a thermo-couple or the like, and is controlled by a temperature regulator 110. The heater 30 can heat the solder-adhered members 40 up to about 400° C. For example, let's assume that the solder-adhered member 40 is an LSI of the bare chip-type and that the melting point of solder is 320° C. In this case, the heater 30 heats the solder 44 up to a temperature, for example, 310° C., below the melting point under the control of the temperature regulator 110. Namely, the heat 30 preheats the solder 44 up to a temperature below the melting point of the solder 44. For example, let's assume that the solder-adhered member 40 is a cooling jacket and that the melting point of solder 44 is 180° C. In this case, the heater 30 heats the solder 44 up to a temperature, for example, 160° C., below the melting point thereof under the control of the temperature regulator 110.

The interior of the chamber 10 is sealed. However, gas within the chamber 10 can be discharged therefrom by operating a vacuum pump VP and by opening a valve B1. Also, inert gas, such as nitrogen gas, can be introduced into the chamber 10 from the exterior by opening a valve B2. The atmosphere can be introduced into the chamber 10 by opening a valve B3. The interior of the chamber 10 is evacuated by the vacuum pump VP, and then nitrogen gas is introduced into the chamber 10, and by doing so, a low oxygen partial pressure condition can be created within the chamber 10. The partial pressure of the oxygen within the chamber 10 can be detected by an oxygen concentration meter 120.

A CCD camera 130 is provided at the outside of the chamber 10. The CCD camera 130 picks up an image of the solder-adhered member 40 through a light-transmitting window W1, mounted on the chamber 10, and outputs this data to the stage control portion 100. The stage control portion 100 drives the X-stage 22 and the Y-stage 24 in accordance with the image of the solder-adhered member 40 picked up by the CCD camera 130 so as to effect the fine adjustment of the solder-adhered member 40 in the X- and Y-directions. Details of the X-Y fine adjustment will be described later with reference to FIG. 4.

A laser displacement gauge 140 is provided at the outside of the chamber 10. The laser displacement gauge 140 applies a laser beam to the solder-adhered member 40 through a window W2, mounted on the chamber 10, and receives the beam reflected by the member 40. The laser displacement gauge 140 measures the distance from it to the solder-adhered member 40 in a non-contact manner in accordance with the reflected beam. In the case where the solder-adhered member 40 is an LSI of the bare chip-type, the uniformly-heating jig 34 can sometimes be thermally deformed to be warped when the solder-adhered members 40 are heated by the heater 30. As a result, the solder-adhered members 40, placed on this jig 34, is inclined. The distance to the solder-adhered member 40 is measured at several points by the use of the laser displacement gauge 140. In the case where the solder-adhered member 40 is a substrate of a large size, this large-size substrate, corresponding to solder-adhered member 40, itself can sometimes be thermally deformed to be warped when the solder-adhered member 40 is heated by the heater. The deformation of this large-size substrate, including warp thereof, is measured by the laser displacement gauge 140.

Results of the measurements are outputted to the stage control portion 100. The stage control portion 100 detects the inclination of the solder-adhered member 40 in accordance with the displacement data detected by the laser displacement gauge 140. In a solder-drawing operation (described later), the stage control portion 100 drives the Z-stage 26 in accordance with the detected inclination of the solder-adhered member 40 so as to effect the fine adjustment of the solder-adhered member 40 in the Z-direction. Details of the Z fine adjustment will be described later with reference to FIGS. 5 and 6.

A solder-drawing head 150 is provided within the chamber 10. The solder-drawing head 150 has a heater provided therein, and this solder-drawing head 150 heats nitrogen gas, supplied from a head control portion 160, by this heater, and blows this heated nitrogen gas onto the solder 44 on the solder-adhered member 40 to melt the solder 44. The solder-drawing head 150 is controlled by the head control portion 160 such that a negative pressure can be produced at a distal end portion of this head 150 so as to draw the molten solder in a non-contact manner. As a result, the residual solder is leveled to have a generally uniform height. Details of the process of drawing the solder by the solder-drawing head 150 will be described later with reference to FIG. 7.

Next, the steps of the solder-removing operation, effected by the solder-removing apparatus of this embodiment, will be described with reference to FIG. 2, and also details of these steps will be described with reference to FIGS. 3 to 7.

Figure 2:
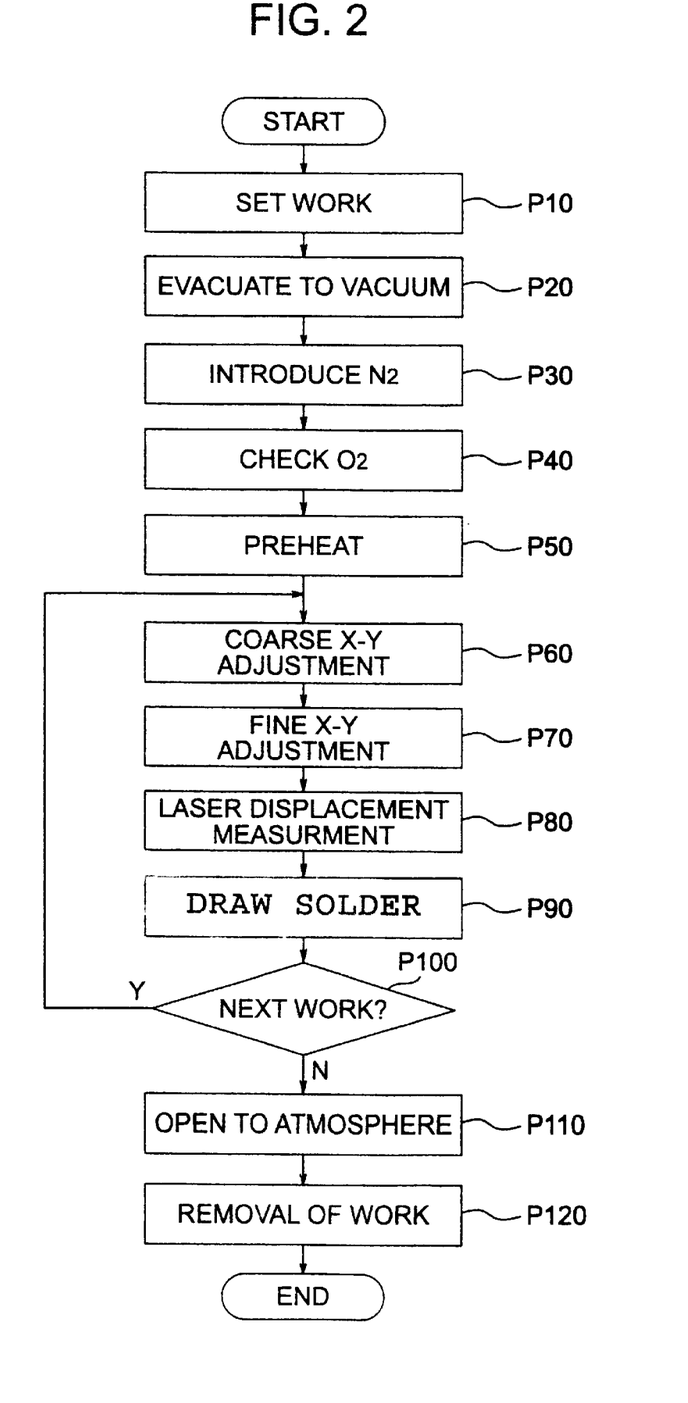
FIG. 2 is a flow chart of the steps of the solder-removing operation of the solder-removing apparatus according to one preferred embodiment of the invention.

FIG. 2 is a flow chart showing the steps of the solder-removing operation effected by one preferred embodiment of the solder-removing apparatus of the invention.

Figure 1:
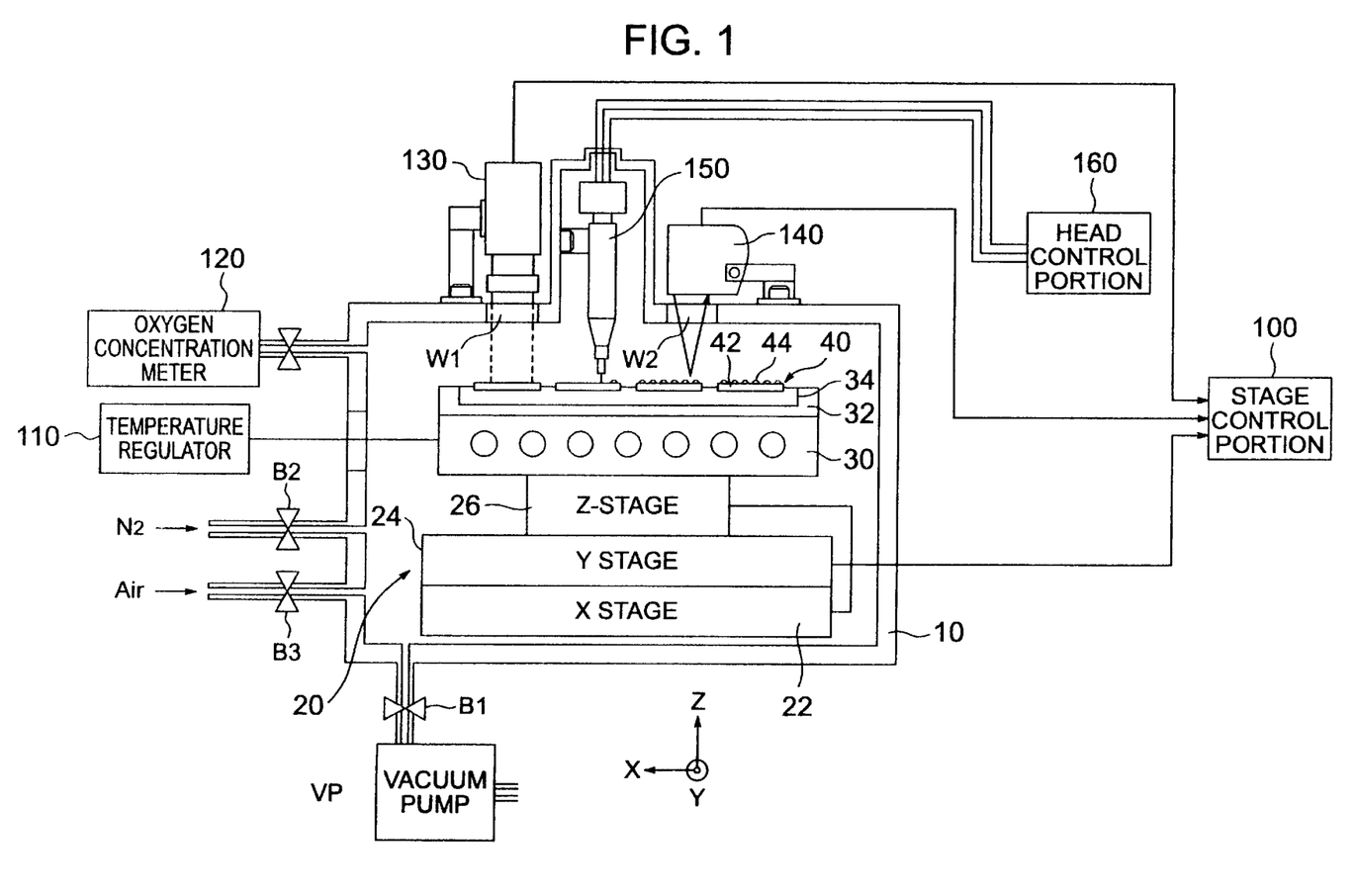
FIG. 1 is a side-elevational view of the overall construction of a solder-removing apparatus according to one preferred embodiment of the invention.

As shown in FIG. 2, in Step P10, a work is set within the solder-removing apparatus shown in FIG. 1. Solder-adhered members 40, from which solder is to be removed, are beforehand set respectively in the pockets in the uniformly-heating jig 34, and the uniformly-heating jig 34, having these solder-adhered members 40 set thereon, is set as a work on the uniformly-heating jig 32 of the solder-removing apparatus.

In Step P20, the valve B1, shown in FIG. 1, is opened, and the vacuum pump VP is operated to evacuate the chamber 10. As a result, the pressure within the chamber 10 is 0.2 Torr.

Then, in Step P30, the valve B2, shown in FIG. 1, is opened, and nitrogen gas is introduced into the chamber 10 from the exterior. As a result, the pressure within the chamber 10 is 800 Torr.

Then, in Step P40, the oxygen concentration within the chamber 10 is checked, using the oxygen concentration meter 120 shown in FIG. 1. For example, the evacuation by the vacuum pump VP and the introduction of the nitrogen gas are repeated so that the oxygen concentration within the chamber 10 becomes not more than 10 ppm. Here, a vacuum suction device is operated, so that the solder-adhered members 40 are fixed to the uniformly-heating jig 34 by suction.

Then, in Step P50, the heater 30 shown in FIG. 1 heats the solder-adhered members 40. The heater 30 is controlled by the temperature regulator 110 so that its heating temperature can be kept at a predetermined temperature. For example, in the case where the solder-adhered member 40 is an LSI of the bare chip-type, and the melting point of the solder 44 is 320° C., the heater 30 preheats the solder 44 to a temperature, for example, 310° C., below the melting point thereof under the control of the temperature regulator 110. In the caser where the solder-adhered member 40 is a cooling jacket, and the melting point of the solder 44 is 180° C., the heater 30 heats the solder 44 to a temperature, for example, 160° C., below the melting point under the control of the temperature regulator 110.

The following is the reason why the heater 30 should heat the solder 44 to a temperature below the melting point thereof, and should not heat the solder to a temperature above the melting point.

It is impossible to bond solder directly to a substrate, and therefore a metallized layer, comprising Au, Cu and Ni, is formed on the substrate in order to bond the solder to the substrate. This metallized layer and the solder diffuse into each other upon heating, so that an intermetallic compound is formed at the interface therebetween, and as a result the metallized layer and the solder are bonded together. When the solder-adhered member 40 is heated to a temperature above the melting point of the solder 44, the mutual diffusion between the solder and the metallized layer proceeds, so that the intermetallic compound grows. The intermetallic compound has poor wettability for solder. Therefore, when this intermetallic compound is exposed to the surface after the solder is leveled, the wettability of the metallized layer for solder is degraded. Therefore, when solder is again supplied onto the metallized layer, the wettability of the solder becomes poor, and besides as the diffusion of the metallized layer and the solder into each other proceeds, the metallized layer is completely extinguished, so that the solder can not be supplied again. Therefore, in Step P50, the heater 30 heats the solder 44 to a temperature below the melting point thereof, thereby preventing the diffusion of the metallized layer and the solder into each other.

In Step P60, the stage control portion 100 drives the X-stage 22 and the Y-stage 24 to effect the X-Y coarse adjustment of the stage so that the solder-adhered member 40A, which is first to undergo a solder-removing operation, can come into the field of vision of the CCD camera 130.

The X-Y coarse adjustment of the stage by the stage control portion 100 will be described with reference to FIG. 3.

Figure 3:
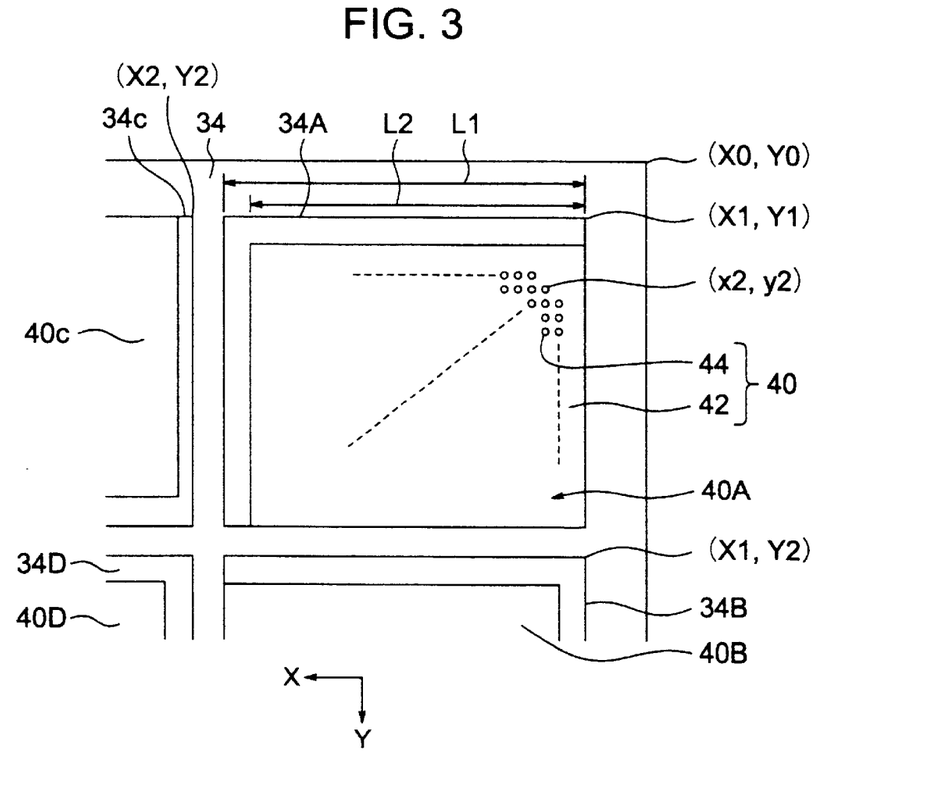
FIG. 3 is an illustration of the step of effecting the X-Y adjustment of a stage in the solder-removing apparatus.

FIG. 3 shows a portion of the plurality of solder-adhered members 40, held on the second uniformly-heating jig 34, on an enlarged scale.

The plurality of pockets 34A, 34B, 34C, 34D, . . . are formed in the second uniformly-heating jig 34. The solder-adhered member 40A is received in the pocket 34A, and is drawn from the reverse side of the sheet of FIG. 3 to be held or fixed in the pocket 34A by suction (vacuum). Similarly, the solder-adhered members 40B, 40C and 40D are held or fixed respectively in the pockets 34B, 34C and 34D by suction.

The length L2 of one side of the solder-adhered member 40A is smaller than the length L1 of one side of the pocket 34A, and therefore the solder-adhered member 40A can be easily inserted into the pocket 34A. For example, in the case where the solder-adhered member 40A is an LSI of the bare chip-type having a square shape each side of which has a length L2 of 19 mm, each side of the pocket 34A has a length L1 of 20 mm. Therefore, when the solder-adhered member 40A is inserted in the pocket 34A, a space or gap of 1 mm is formed between the solder-adhered member 40A and the side (inner peripheral) surface of the pocket 34A in an upward-downward direction and a right-left direction (FIG. 3). The direction of this space varies, depending on the condition of insertion and the subsequent conveyance, and hence is not constant. For example, in FIG. 3, the solder-adhered member 40A is held in a fixed position by suction, with its lower right corner portion held in contact with a lower right corner portion of the pocket 34A, and the space is formed at the upper and left sides. In FIG. 3, a space is formed between the right side of the solder-adhered member 40B and the side surface of the pocket 34B and between the upper side of the member 40B and the side surface of the pocket 34B. Therefore, the solder 44 on the solder-adhered member 40 is displaced relative to the second uniformly-heating jig 34 serving as a reference.

The position (Coordinates; (X0, Y0)) of the upper right corner of the second uniformly-heating jig 34 is a reference position for the adjustment of the position of the stage. The position (Coordinates; (X1, Y1)) of the upper right corner of the pocket 34A, formed in the second uniformly-heating jig 34, is fixed relative to the reference position (Coordinates: (X0, Y0)), and is also used as a reference position in the stage adjusting process.

For drawing the solder, the solder-drawing head 150 need to be accurately located on each of the plurality of solder bumps 44. In Step P60, the stage control portion 100 drives the X- and Y-stages 22 and 24 to adjust the position of the stage 20 so that the upper right corner (Coordinates; (X1, Y1)) of the pocket 34A, having the solder-adhered member 40A received therein, can come into the field of vision of the CCD camera 130.

The second uniformly-heating jig 34 is received and fixed in the recess in the first uniformly-heating jig 32, and therefore there are occasions when a small gap is formed between the first and second uniformly-heating jigs 32 and 34. In such a case, the position (Coordinates; (X0, Y0)) of the upper right corner of the second uniformly-heating jig 34 may vary. In such a case, the stage control portion 100 uses the upper right corner of the first uniformly-heating jig 32 as a reference. And, the stage control portion 100 coarsely adjusts the position of the stage 20 so that the upper right corner of the pocket 34A, having the solder-adhered member 40A received therein, can come into the field of vision of the CCD camera 130.

In Step P70, the stage control portion 100 drives the X-stage 22 and the Y-stage 24 to effect the fine X-Y adjustment of the stage so that a point on the solder-adhered member 40A, which serves as a reference, can come into the center of the field of vision of the CCD camera 130. An invariable position, such as the center of the solder ball (solder bump), a point on a circuit pattern and a corner portion, is used as this point serving as the reference.

The process of fine X-Y adjustment of the stage by the stage control portion 100 will be described with reference to FIG. 4.

Figure 4:
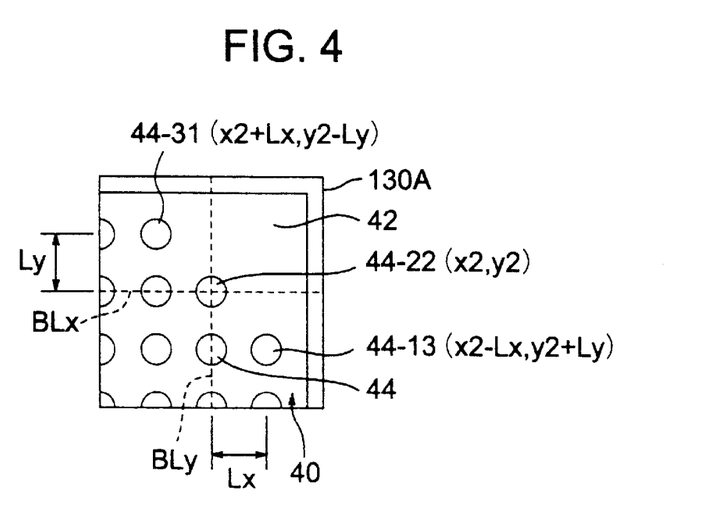
FIG. 4 is an illustration of the step of effecting the fine X-Y adjustment of the stage in the solder-removing apparatus.

FIG. 4 is an enlarged, fragmentary view of an image of the solder 44 on the solder-adhered member 40, picked up by the CCD camera 130.

An X-direction reference line BLx and a Y-direction reference line BLy are provided on a monitor screen 130A displaying the image picked up by the CCD camera 130. The intersection of the two reference lines BLx and Bly is the center of the field of vision of the CCD camera 130.

In the illustrated condition, the upper right corner of the substrate 42 of the solder-adhered member 40 is disposed in the field of vision.

The stage control portion 100 drives the X-stage 22 and the Y-stage 24 to effect the fine X-Y adjustment of the stage so that for example, the solder bump 44-22 among the solder bumps 44 adhered to the solder-adhered member 40, disposed in the vicinity of the corner of the substrate, can be located at the center of the field of vision of the CCD camera 130. The reason why any corner of the substrate is not used as a reference position is that chipping or the like can occur at the corner of the substrate, and therefore the distance from the corner to the solder 44 is not constant. The fine adjustment of the stage is thus effected so as to locate the solder bump 44-22 at the center of the field of vision of the CCD camera 130, and by doing so, the position of the solder bump 44-22 is represented, for example, by the coordinates (x2, y2). The positions of the other solder bumps relative to this reference solder bump 44-22 can be found by design data. For example, the solder bumps 22 are spaced a predetermined distance Lx from one another in the X-direction, and are spaced a predetermined distance Ly from one another in the Y-direction. In this case, if the position of the solder bump 44-22 is represented by the coordinates (x2, y2), the solder bump 44-31 can be represented by the coordinates (x2+Lx, y2−Ly), and the position of the solder bump 44-13 can be represented by the coordinates (x2−Lx, y2+Ly). Therefore, the positions of the plurality of solder bumps 44 can be found, and the center of each of these solder bumps 44 can be accurately located beneath the solder-drawing head 150 at the later step.

Then, in Step P80, in accordance with the accurate position of the solder 44 obtained by the X-Y fine adjustment of Step P70, the stage control portion 100 drives the X-stage 22 and the Y-stage 24 to move the solder-adhered member 40 to a position under the laser displacement gauge 140. The laser displacement gauge 140 measures the distance to the solder-adhered member 40 in a non-contact manner.

The process of laser displacement measurement by the laser displacement gauge 140 will be described with reference to FIG. 5.

In the case where the solder-adhered member 40 is an LSI of the bare chip-type, the uniformly-heating jig 34 can sometimes be thermally deformed to be warped when the solder-adhered member 40 is heated by the heater 30, although the semiconductor substrate is not warped. When the uniformly-heating jig 34 is warped, the solder-adhered member 40, placed on this jig 34, is inclined at an angle θ relative to a horizontal plane, as shown in FIG. 5.

The laser displacement gauge 140 measures the distance H1 to that portion of the substrate 42 disposed near to the solder bump 44-1. When the solder-adhered member 40 is inclined, the distance H2 to the solder bump 44-2, disposed adjacent to the solder bump 44-1, is different from the distance H1. Here, let's assume that the vertical distance between the distal end of the laser displacement gauge 140 and the distal end of the solder-drawing head 150 is H0. In the solder-drawing process of Step P90 (described later), the stage control portion 100 drives the Z-stage 26 (shown in FIG. 1) so that the distance between the substrate 42 and the distal end of the solder-drawing head 150 becomes ΔH. The distance ΔH between the distal end of the solder-drawing head 150 and the substrate 42 is kept generally constant, and by doing so, the height of the residual solder, remaining on the substrate 42 after the solder 44 on the substrate 42 is drawn by the solder-drawing head 150, is made generally uniform.

In Step P80, the laser displacement gauge 140 measures the distance to the solder-adhered member 40 at several points. In accordance with results of this measurement, the stage control portion 100 obtains the inclination of the solder-adhered member 40. Therefore, in the solder-drawing process of Step P90, the stage control portion 100 controls the Z-stage 26 so that the distance ΔH between the substrate 42 and the solder-drawing head 150 can be kept constant.

Figure 6:
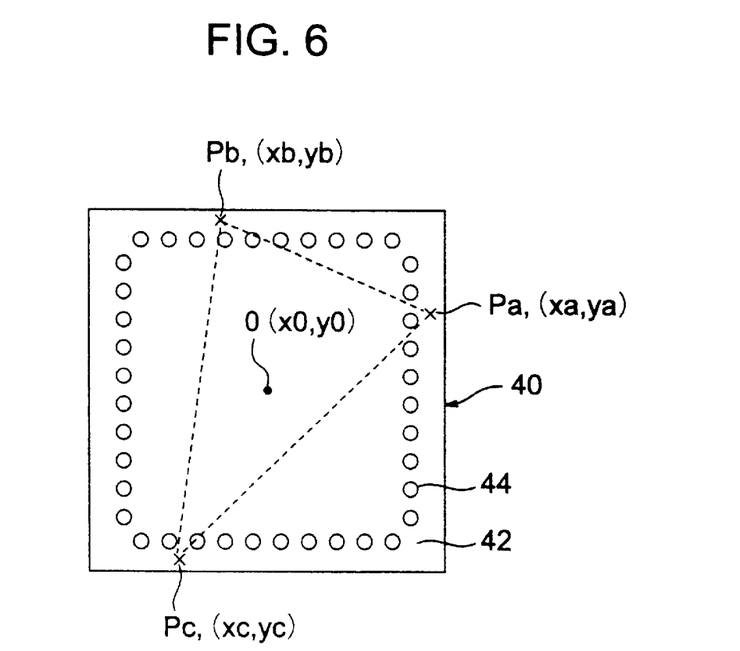
FIG. 6 is an illustration of the manner of obtaining the inclination of a solder-adhered member in a laser displacement measurement step.

A method of determining the inclination of the solder-adhered member 40 in the laser displacement measurement process will be described with reference to FIG. 6.

The plurality of solder bumps 44 are adhered to the substrate 42 of the solder-adhered member 40. The stage control portion 100 drives the X-stage 22 and the Y-stage 24, and by doing so, three points (positions) Pa, Pb and Pc are sequentially located at the measuring position under the laser displacement gauge 140. The laser displacement gauge 140 measures the distance Ha, Hb and Hc between the laser displacement gauges 140 and the substrate 42 at the three points Pa, Pb and Pc. Here, if the position of the center of gravity of the solder-adhered member 40 is represented by (x0, y0), and the positions Pa, Pb and Pc are represented by (xa, ya), (xb, yb) and (xc, yc), respectively, the positions P1, P2 and P3 are so selected that the center position with respect to the positions Pa, Pb and Pc coincides with the position of the center of gravity, that is, $x0=\frac{1}{3}(xa+xb+xc)$ and $y0=\frac{1}{3}(ya+yb+yc)$ are established. The positions Pa, Pb and Pc are disposed respectively on those portions of the substrate 42 to which the solder 44 is not adhered. With this method, the stage control portion 100 can determine the flat surface of the solder-adhered member 40 from the distance Ha, Hb and Hc between the laser displacement gauge 140 and the substrate 42 at the three points (positions) Pa, Pb and Pc, and the inclination (the angle and direction of inclination) of the solder-adhered member 40 can be obtained.

Figure 5:
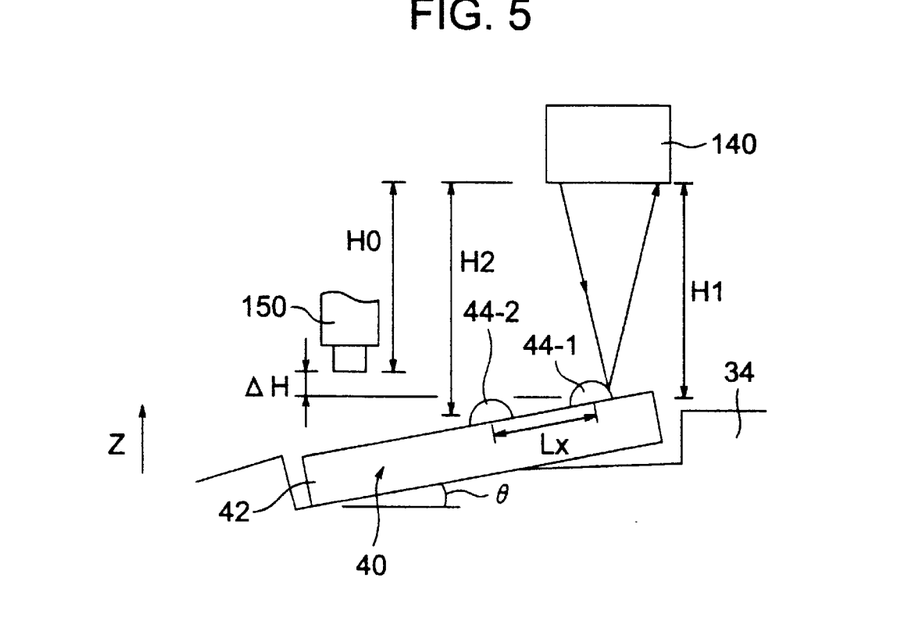
FIG. 5 is an illustration of a laser displacement measurment process in solder removal.

For example, when the solder-adhered member 40, shown in FIG. 5, is inclined at an angle θ in the X-direction (and is not inclined in the Y-direction), and the distance between the laser displacement gauge 140 and the substrate 42 is H1, the distance H2 between the laser displacement gauge 140 and the substrate 42 at the solder bump 44-2, disposed adjacent to the solder bump 44-1, can be obtained from H2=H1+Lx·sinθ. Similarly, the distance between the laser displacement gauge 140 and the substrate 42 at each of the other solder bumps 44 on the substrate 42 can be obtained.

The foregoing explanation has been made with respect to the case where the solder-adhered member 40 is an LSI of the bare chip-type. In the case where the solder-adhered member 40 is a large-size substrate, this large-size substrate (forming the solder-adhered member 40) itself is thermally deformed when this solder-adhered member 40 is heated by the heater 30. This deformation of the large-size substrate can be measured by the laser displacement gauge 140.

Thus, the stage control portion 100 measures the displacement of the substrate (i.e., the inclination of the substrate due to warp of the uniformly-heating jig, holding the semiconductor substrate, and warp of the substrate), caused by heating, in a non-contact manner, using the laser displacement gauge.

In Step P90, the solder-drawing head 150 sequentially draws the solder bumps 44 adhered to the substrate 42 of the solder-adhered member 40. During this operation, the stage control portion 100 drives the X-stage 22 and the Y-stage 24 in the direction of arrangement of the solder bumps 44, and also drives the Z-stage 26 in accordance with the inclination of the solder-adhered member 40, measured in Step P80, so that the distance between the substrate 42 and the solder-drawing head 150 becomes ΔH. The distance ΔH between the distal end of the solder-drawing head 150 and the substrate 42 is kept generally constant, and by doing so, the height of the residual solder, remaining on the substrate 42 after the solder 44 on the substrate 42 is drawn by the solder-drawing head 150, is made generally uniform.

Details of the process of drawing the solder by the solder-drawing head 150 will be described with reference to FIG. 7.

Figure 7A:
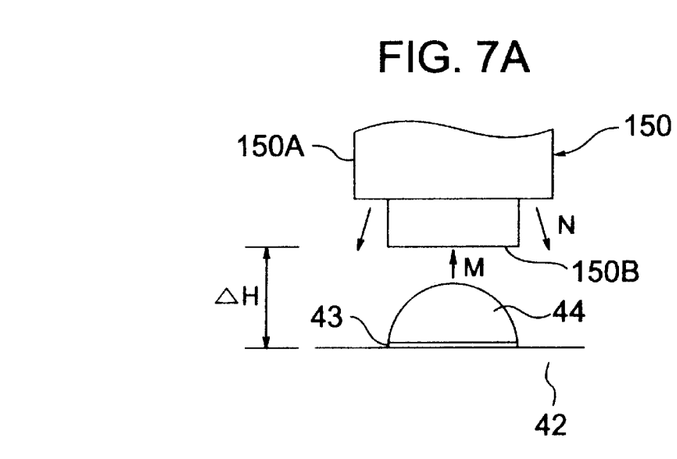
FIGS. 7A to 7D are views showing a solder-drawing process.

As shown in FIG. 7A, the distal end portion of the solder-drawing head 150 comprises an outer tube 150A, and an inner tube 150B mounted inside the outer tube 150A in coaxial relation thereto. Nitrogen gas, heated by the heater, is jetted from a space between the outer and inner tubes 150A and 150B. Suction, exerted in a direction of arrow M, is produced within the inner tube 150B by a negative pressure.

A metallized layer 43 is formed on the substrate 42, and the solder 44 is adhered to the metallized layer 43. For example, the metallized layer 43 is formed by depositing titanium (Ti), nickel (Ni) and gold (Au) sequentially on the substrate 42.

As described above with respect to FIG. 1, the solder 44 is heated by the heater 30. In the case where the melting point of the solder 44 is 320° C., the temperature of preheating by the heater 30 is 310° C., and therefore the solder 44 will not be melted only by the heating by the heater 30. Therefore, the metallized layer 43 will not diffuse into the solder 44. On the other hand, the temperature of the high-temperature nitrogen gas N, blown onto the solder 44 from the solder-drawing head 150, is, for example, 450° C. The solder 44, preheated by the heater 30, is melted when the high-temperature nitrogen gas is blown thereto from the solder-drawing head 150. At this time, the stage control portion 100 controls the Z-stage 26 so that the distance between the solder-drawing head 150 and the substrate 42 becomes ΔH (for example, 100 μm).

Figure 7B:
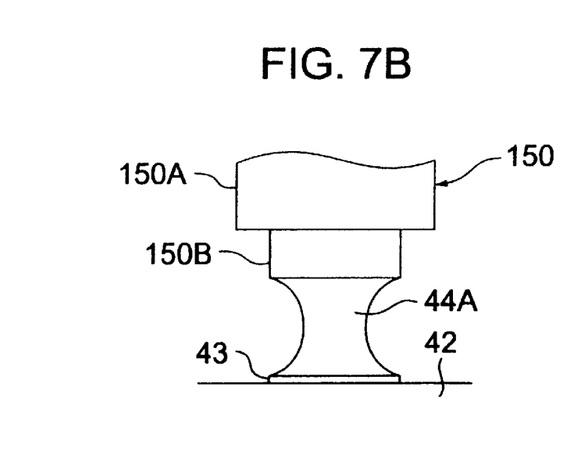

As shown in FIG. 7B, the molten solder 44A is drawn by the solder-drawing head 150.

As described above with respect to FIG. 1, the solder-adhered members 40 are held within the chamber 10. Nitrogen gas is introduced into the chamber 10, so that the interior of this chamber 10 is kept in a low-oxygen atmosphere (for example, the oxygen concentration is not more than 100 ppm).

Figure 7C:
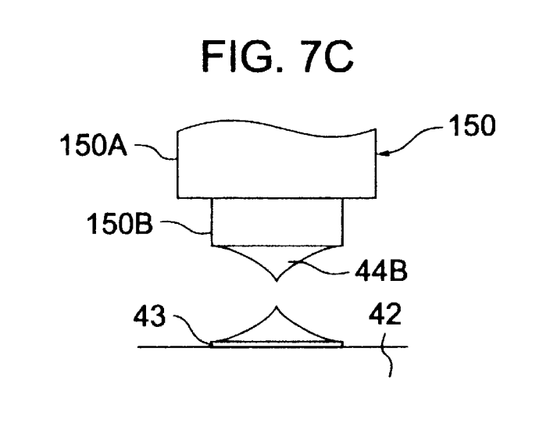

As shown in FIG. 7C, most of the solder is drawn by the solder-drawing head 150, so that part of the solder remains on the solder-adhered member 40.

Figure 7D:
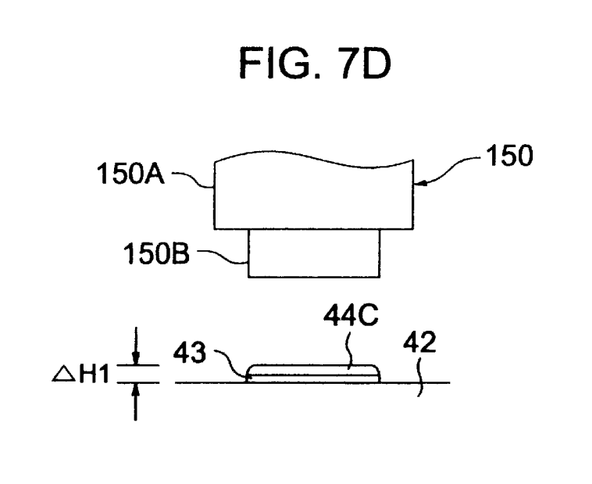

The solder 44 is drawn in the low-oxygen atmosphere, so that the residual solder (i.e., the remaining part of the drawn solder 44) is stable in shape. As a result, a variation in the amount of the residual solder 44C is suppressed as shown in FIG. 7D. The amount of the residual solder 44C is small, and therefore is spread generally flat over the metallized layer 43, and its height ΔH1 is not more than 30 μm, and for example 20 μm±10 μm. Thus, the residual solder, remaining after removal of the unnecessary solder by suction, is leveled.

In the example shown in FIG. 7, the diameter of the distal end portion of the solder-drawing head 150 is substantially equal to the diameter of the solder 44. However, in the case where the diameter of the distal end portion of the solder-drawing head 150 is larger than the diameter of the solder 44, the solder-drawing head 150 can draw a plurality of solder bumps 44 at a time. In this case, also, a variation in the amount of the residual solder, remaining on the solder-adhered member 40, is suppressed.

After the removal of the plurality of solder bumps on the solder-adhered member 40 is finished, Step P100 is effected. In Step P100, it is judged whether or not the next work, i.e. the next solder-adhered members 40, exists, and if the next work, i.e. the next solder-adhered members 40, exists, the process from Step P60 to Step P90 is repeated. If the next solder-adhered member does not exist, Step P110 is effected.

In Step P110, the solder-adhered members 40 are cooled to a temperature, for example, 80° C., sufficiently lower than the melting point of the solder 44, and then the vacuum pump VP shown in FIG. 1 is stopped, and the valve B1 is closed, and the valve B3 is opened, thereby introducing the atmosphere into the chamber 10.

Then, in Step P120, the second uniformly-heating jig 34, which is placed on the first uniformly-heating jig 32, and has the solder-adhered members 40 placed thereon, is removed from the first uniformly-heating jig 32. The solder-adhered members 40, subjected to the leveling operation, is taken out of the chamber 10.

Next, the steps of the solder-removing operation, effected by the solder-removing apparatus for a large-size substrate (solder-adhered member), will be described with reference to FIGS. 8 to 10. In the description given blow, although the large substrate is a cooling jacket used in a high-density module, a similar process can be applied in the case where the large substrate is a printed circuit board or the like.

First, the construction of the cooling jacket will be described with reference to FIGS. 8 and 9.

Figure 8:
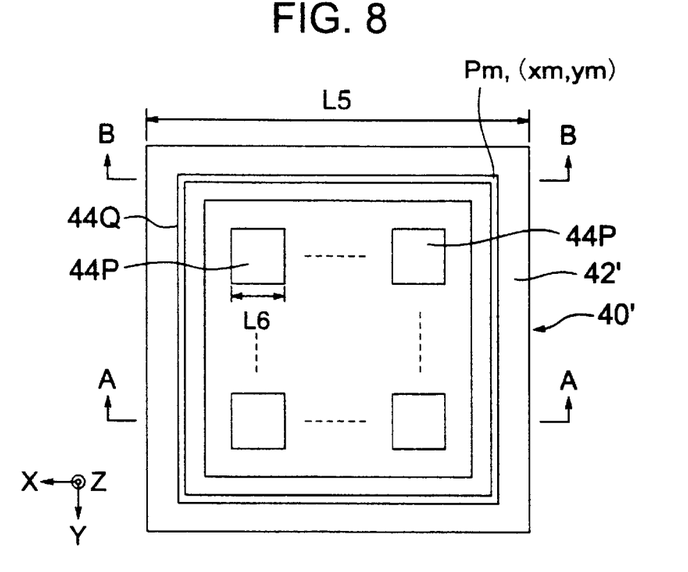
FIG. 8 is a plan view of a cooling jacket from which solder is to be removed.

As shown in FIG. 8, the solder-adhered member 40' in this embodiment comprises a substrate (cooling jacket body) 42' made of aluminum nitride (AlN), and two kinds of solders 44P and 44Q adhered to an obverse surface of this substrate. As shown in FIG. 9, a radiating fins 42B are formed on a reverse surface of the substrate 42'. The substrate 42' has a substantially square shape, and the length of one side thereof is, for example, 150 mm.

The plurality of solders (solder bumps) 44P are formed on the substrate 42'. The solders 44P fixedly secure the substrate 42' to a cap of an LSI chip, sealed in the high-density module, and are used for radiating heat from the LSI through the cooling jacket. The size of the solder 44P is determined depending on the size of the LSI to which the cooling jacket is to be fixedly secured. The solder 44 is bonded to the substrate 42' through a metallized layer formed on this substrate 42'.

The solder 44Q bonds the cooling jacket to a frame, forming a shell of the high-density module, and seals the high-density module. Therefore, the solder 44Q is formed in a rectangular shape on an outer peripheral portion of the substrate 42' as shown in the drawings. The solder 44Q is also bonded to the substrate 42' through a metallized layer formed on this substrate 42'. The solders 44P and the solder 44Q have the same melting point which is, for example, 180° C.

Figure 9:
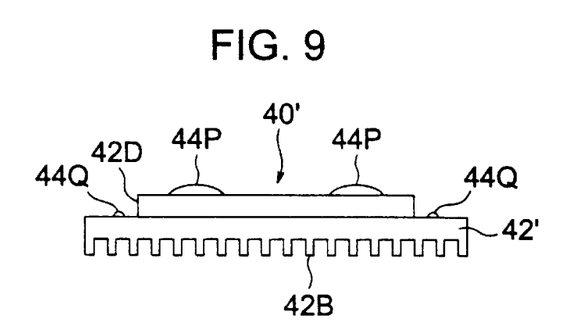
FIG. 9 is a cross-sectional view taken along the line A—A of FIG. 8.

As shown in FIG. 9, the substrate 42' has such a shape that its central portion is projected, and more specifically the substrate 42' has a projected portion 42D. The solders 44P are formed on the projected portion 42D, and the solder 44Q is formed on the substrate in surrounding relation to the projected portion 42D. The surface, on which the solders 44P are formed, is stepped relative to the surface on which the solder 44Q is formed.

The solders 44 can be removed, for example, by pressing a Cu plate against them. However, such a Cu plate can not be pressed against the solder 44Q since the solder 44Q is formed in surrounding relation to the projected portion 42D. Therefore, the solder 44Q can not be effectively removed with the method of pressing the Cu plate.

And besides, the cooling jacket is large in size, and therefore initial warp of the cooling jacket is too large to be ignored. The radiating fins, assuming a concave-convex configuration, are formed on the obverse surface of the cooling jacket, and the reverse surface thereof is substantially flat. The obverse and reverse surfaces of the cooling jacket are thus different in configuration from each other, and therefore warp develops in the cooling jacket upon heating. Generally, it is difficult to remove the solder 44Q, adhered to the warped substrate 42' in such a manner that the residual solder has generally uniform height.

The process of removing the solder from the cooling jacket by the solder-removing apparatus will be described with reference to FIG. 2.

Contents of Steps P10 to P120 are basically similar to those described above for the process in which the solder-adhered member is the LSI of the bare chip type. The steps of the process will be described sequentially.

Steps P10 to P40 are similar to those described above.

In Step P50, the heater 30 shown in FIG. 1 heats the solder-adhered member 40'. The heater 30 is controlled by the temperature regulator 110 so that its heating temperature can be kept at a predetermined temperature. The solder-adhered member 40' is the cooling jacket, and the melting point of the solders 44P and 44Q is 180° C., and therefore the heater 30 preheats the solders 44C and 44Q to a temperature, for example, 170° C., below the melting point of the solders 44C and 44Q.

In Step P60, the stage control portion 100 drives the X-stage 22 and the Y-stage 24 to effect the X-Y coarse adjustment of the stage so that the solder-adhered member 40' can come into the field of vision of the CCD camera 130. The cooling jacket is larger in size than the LSI of the bare chip-type, and therefore only one cooling jacket is received in the uniformly-heating jig 34. In the X-Y coarse adjustment process, the stage control portion 100 uses the position (Coordinates; (X0, Y0)) of the upper right corner of the second uniformly-heating jig 34 as a reference position. The stage control portion 100 drives the X-stage 22 and the Y-stage 24 to adjust the position of the stage 20 so that the position (Coordinates; (X1, Y1)) of the upper right corner of a pocket, formed in the uniformly-heating jig 34 for holding the cooling jacket therein, can come into the field of vision of the CCD camera 130.

In Step P70, the stage control portion 100 drives the X-stage 22 and the Y-stage 24 to effect the fine X-Y adjustment of the stage so that a reference point on the solder-adhered member 40', such for example as that portion of the solder disposed at the upper right corner (Pm; Coordinates (xm, ym) in FIG. 8), can be located at the center of the field of vision of the CCD camera 130.

In Step P80, in accordance with the accurate position of the solder 44Q obtained by the X-Y fine adjustment of Step P70, the stage control portion 100 drives the X-stage 22 and the Y-stage 24 to move the solder-adhered member 40' to a position under the laser displacement gauge 140. The laser displacement gauge 140 measures the distance to the solder-adhered member 40' in a non-contact manner.

In the case where the solder-adhered member is an LSI of the bare chip type, the LSI of the bare chip type itself is not deformed, but the uniformly-heating jig 34, holding the LSIs, is deformed. Therefore, the LSI becomes inclined from a horizontal condition. Therefore, the stage control portion 100 measures the nature (angle and direction of inclination) of inclination of the LSI, and controls the Z-stage in accordance with this inclination.

On the other hand, in the case where the solder-adhered member is the cooling jacket, the substrate itself is warped. In this case, the stage control portion 100 can not measure the inclination of the substrate by obtaining the heights of three points on the substrate as described above for FIG. 6.

The process of laser displacement measurement by the laser displacement gauge 140 in this embodiment will be described with reference to FIG. 10.

Figure 10:
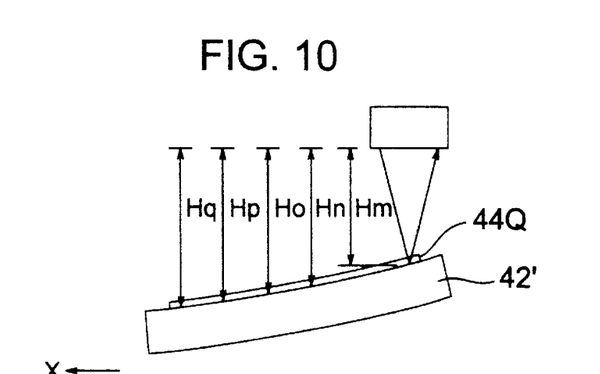
FIG. 10 is an illustration of a laser displacement measurement step.

FIG. 10 is a cross-sectional view taken along the line B—B of FIG. 8. Here, for simplifying the description, let's assume that the substrate 42', subjected to the heating operation, is warped in a plane, including the X axis and the Z axis, as shown in FIG. 10.

The laser displacement gauge 140 measures the distance Hm to that portion of the substrate 42' disposed near to the solder 44Q. Further, the stage control portion 100 moves the substrate 42' in the X-direction, and by doing so, the laser displacement gauge 140 measures the distance Hn, Ho, Hp and Hq to the substrate 42' at a plurality of points. The stage control portion 100 receives results of this measurement. The approximate distance from the laser displacement gauge 140 to the substrate 42' at a region between any two adjacent measurement points is calculated, using the measured values Hm, Hn, Ho, Hp and Hq. By doing so, the stage control portion 100 can measure the warp of the substrate 42'.

In Step P90, the solder-drawing head 150 draws the solder 44Q adhered to the substrate 42' of the solder-adhered member 40'. During this operation, the stage control portion 100 drives the X-stage 22 and the Y-stage 24 in the direction of extending of the solder 44Q, and also drives the Z-stage 26 shown in FIG. 1 in accordance with the inclination of the solder-adhered member 40', measured in Step P80, so that the distance between the substrate 42' and the solder-drawing head 150 becomes ΔH. Under the control of the stage control portion 100, the distance ΔH between the distal end of the solder-drawing head 150 and the substrate 42' is kept generally constant, and by doing so, the height of the residual solder, remaining on the substrate 42' after the solder 44Q on the substrate 42' is drawn by the solder-drawing head 150, is made generally uniform.

After the removal of the solder on the solder-adhered member 40' is finished, Step P100 is effected. In Step P100, it is judged whether or not the next work, i.e. the next solder-adhered member 40', exists. In this case, the next solder-adhered member 40' does not exist, and therefore Step P110 is effected.

In Step P110, the solder-adhered member 40' is cooled to a temperature, for example, 80° C., sufficiently lower than the melting point of the solders 44P and 44Q, and then the vacuum pump VP shown in FIG. 1 is stopped, and the valve B1 is closed, and the valve B3 is opened, thereby introducing the atmosphere into the chamber 10.

Then, in Step P120, the second uniformly-heating jig 34, which is placed on the first uniformly-heating jig 32, and has the solder-adhered member 40' placed thereon, is removed from the first uniformly-heating jig 32. The solder-adhered member 40', subjected to the leveling operation, is taken out of the chamber 10.

In the foregoing description, the stage control portion 100 drives the Z-stage 26 so that the distance between the solder drawing head 150 and the solder-adhered member 40, 40' can be kept constant, and the inclination of the solder-adhered member 40 due to the warp of the uniformly-heating jig 34 or the warp of the solder-adhered member 40' due to the warp of the uniformly-heating jig 34 is corrected. However, the solder-drawing head 150 may be moved upward and downward in the Z-direction. In this case, in order to enhance the precision of the movement in the Z-direction, it is necessary to increase the rigidity of a support member supporting the solder-drawing head 15. On the other hand, in the case where the Z-stage is moved upward and downward, such a rigidity problem is not encountered. In the case where a space, in which a mechanism for vertically moving the solder-drawing head 150 is provided, is not available around the solder-drawing head 150, it is advantageous to move the Z-stage upward and downward.

The solder, adhered to the solder-adhered member, is preheated to a temperature below the melting point of the solder by the heater 30, and further the solder is melted by the high-temperature nitrogen gas blown from the solder-drawing head 150. However, the solder can be heated to a temperature above the melting point of the solder by the heater 30.

As described above, in the solder-removing apparatus of this embodiment, the solder, adhered to the LSI of the bare chip-type, and the solder or the like, adhered to the cooling jacket of a stepped configuration, can be easily removed, and therefore the general-purpose ability of the solder-removing apparatus can be enhanced.

The stage control portion measures the inclination or warp of the solder-adhered member, and effects the control in accordance with the measured inclination or the measured warp so that the distance between the solder drawing head and the substrate of the solder-adhered member can be kept constant. Therefore, the height of the residual solder, remaining on the solder-adhered member after the unnecessary solder is removed from the solder-adhered member, is made generally uniform.

The solder-removing apparatus includes the Z-stage, and this Z-stage is moved upward and downward so that the distance between the solder-drawing head and the solder-adhered member can be kept constant. Therefore, the precision of the movement in the Z-direction can be enhanced.

The solder, adhered to the solder-adhered member, is preheated to a temperature below the melting point of the solder by the heater through the uniformly-heating jigs, and at the time of drawing the solder, the solder is melted by the high-temperature gas blown from the solder-drawing head. Therefore, the metallized layer, formed on the substrate, is prevented from diffusing into the solder, and the good wettability of the substrate for solder can be obtained. Therefore, the repairing operation can be carried out easily.

The melting and removal of the solder are effected in an atmosphere of inert gas with a lower oxygen concentration. Therefore, the oxidation of the melted solder is prevented. Therefore, the surface tension of the molten solder is prevented from increasing, and the shape of the molten solder is stable at the time of drawing the solder. Therefore, the amount of the solder, remaining on the solder-adhered member, is uniform, and the precision of leveling of the solder is enhanced.

In the case where solder is melted in the atmosphere, a flux is used in order to prevent an oxide from being formed on the surface of the solder. However, when the flux is used, it is necessary to wash the residual flux out after the solder-removing operation is finished.

In the solder-removing apparatus of this embodiment, the melting of the solder is effected in an atmosphere of inert gas with a lower oxygen concentration, and therefore the use of a flux is not necessary. Therefore, the flux washing-out operation is not necessary, and the time, required for the solder-removing operation, is reduced. In the case where the solder-adhered member is an LSI of the bare chip-type, there is a fear that cracking or the like develops in the bare chip when the flux washing-out operation is effected. However, with the use of the solder-removing apparatus of this embodiment, the flux washing-out operation is not necessary, and therefore the bare chip will not be subjected to cracking or the like. And besides, when the flux is used, the flux is scattered within the chamber at a high temperature, and deposits on the inner surface of the chamber, and therefore, the maintenance, such as the washing of the chamber, must be carried out periodically. In the solder-removing apparatus of this embodiment, such maintenance is not necessary.

What is claimed is:

1. A solder-removing apparatus for removing solder from an object, comprising:

a heating portion for heating the object having the solder adhered thereto;

a measuring portion for measuring the distance from said measuring portion to at least two points of the object;

a solder-drawing portion for drawing the molten solder on the object by suction;

an X-Y moving portion for moving the object in an X-direction or a Y-direction;

a Z moving portion for moving the object relative to said solder-drawing portion in a Z-direction; and a control portion for controlling said X-Y moving portion and said Z moving portion;

wherein said control portion obtains displacement of the object in accordance with measured results during the time when the molten solder on the object is drawn by said solder-drawing portion, said control portion causes said X-Y moving portion to move the object, and also causes said Z moving portion to move the object relative to said solder-drawing portion in accordance with said obtained displacement, so that the distance between said solder-drawing portion and the object can be kept constant.

2. A solder-removing apparatus according to claim 1, further comprising a chamber within which said heating portion, said solder-drawing portion, said X-Y, moving portion and said Z moving portion are received, wherein said chamber has a discharge portion for discharging gas within said chamber, and a gas-introducing portion for introducing gas into said chamber; and wherein an oxygen concentration of an atmosphere in said chamber is adjusted to a value lower than an oxygen concentration of the ambient atmosphere, and the heating by said heating portion and the drawing of the molten solder by said solder-drawing portion are effected in said atmosphere.

3. A solder-removing apparatus according to claim 1, in which said heating portion heats the object to a temperature below a melting point of the solder adhered to the object, and said solder-drawing portion includes a solder-melting portion for blowing high-temperature gas onto the solder to melt the same.

4. A solder-removing apparatus according to claim 1, which includes means for moving the object in the Z-direction.

5. A solder-removing apparatus according to claim 1, in which said measuring portion applies a laser beam to the object, and receives the laser beam reflected by the object, thereby measuring the distance between said measuring portion and said object.

6. A solder-removing apparatus according to claim 1, in which the object is received in a pocket formed in a uniformly-heating jig, and is heated by said heating portion.

7. A method of removing solder from an object, comprising the steps of:

placing the object, having the solder adhered thereto, in an atmosphere which is lower in oxygen concentration than the ambient atmosphere;

adjusting the position of the object;

obtaining displacement of the object by measuring a distance to at least two points of the object;

heating the object to melt the solder;

moving the object in an X-direction or a Y-direction, and keeping the distance between the solder-drawing position and the object to a predetermined value in accordance with the displacement of the object; and drawing the molten solder at a position spaced a predetermined distance from the object.

8. A method according to claim 7, in which said step of heating the object includes a step of heating the object to a temperature lower than a melting point of the solder, and said step of drawing the solder includes the step of blowing high-temperature gas onto the solder to melt the same.

9. A method according to claim 7, in which said step of keeping the distance includes the step of controlling the movement of the object in a Z-direction in accordance with the displacement of the object.

10. A method according to claim 7, in which said step of adjusting the position of the object includes the step of picking up an image of the object, and the step of locating a reference point of the object at the center of an image picking-up portion.

11. Apparatus for removing solder from an object, comprising:

means for receiving the object, the interior of said receiving means being controlled to an atmosphere having an oxygen concentration lower than an oxygen concentration of the ambient atmosphere;

means for adjusting the position of the object;

means for measuring a distance to at least two points of the object;

means for obtaining displacement of the object by the measured distance;

means for heating the object;

means for moving the object in an X-direction or a Y-direction;

means for keeping the distance between drawing means and the object to a predetermined value in accordance with the displacement of the object; and means for drawing a molten solder by suction from a position spaced a predetermined distance from the object.

12. Apparatus according to claim 11, in which said heating means heats the object to a temperature below a melting point of the solder, and said solder-drawing means includes means for blowing high-temperature gas onto the solder to melt the same.

13. Apparatus according to claim 11, in which said means for keeping the distance to the predetermined value includes means for controlling the movement of the object in a Z-direction in accordance with the displacement of the object.

14. Apparatus according to claim 11, in which said means for adjusting the position of the object includes means for picking up an image of the object, and means for locating a reference point of the object at the center of said image picking-up means.

* * * * *